United States Patent
Masci et al.

(10) Patent No.: US 12,483,131 B2
(45) Date of Patent: Nov. 25, 2025

(54) DITHERING FOR CONSTANT ON TIME CONTROL LOOP

(71) Applicant: STMicroelectronics International N.V., Geneva (CH)

(72) Inventors: Giovanni Masci, Charvensod (IT); Andrea Villot, Aosta (IT); Niccolo' Brambilla, San Donato Milanese (IT)

(73) Assignee: STMicroelectronics International N.V., Geneva (CH)

( * ) Notice: Subject to any disclaimer, the term of this patent is extended or adjusted under 35 U.S.C. 154(b) by 18 days.

(21) Appl. No.: 18/583,063

(22) Filed: Feb. 21, 2024

(65) Prior Publication Data

US 2025/0266762 A1    Aug. 21, 2025

(51) Int. Cl.
  *H02M 1/44* (2007.01)
  *H02M 3/157* (2006.01)
  *H03K 4/48* (2006.01)

(52) U.S. Cl.
  CPC ............. *H02M 3/157* (2013.01); *H02M 1/44* (2013.01); *H03K 4/48* (2013.01)

(58) Field of Classification Search
  CPC .......... H02M 1/44; H02M 3/157; H03K 4/06; H03K 4/48
  USPC ................................ 327/100, 172, 176, 291
  See application file for complete search history.

(56) References Cited

U.S. PATENT DOCUMENTS

| | | | |
|---|---|---|---|
| 2023/0246549 A1 | 8/2023 | Davis-Marsh et al. | |
| 2024/0421691 A1* | 12/2024 | Brambilla | H02M 3/157 |
| 2024/0421708 A1* | 12/2024 | Brambilla | H02M 1/0025 |

FOREIGN PATENT DOCUMENTS

| | | |
|---|---|---|
| CN | 107276413 A | 10/2017 |
| CN | 107359789 A | 11/2017 |
| CN | 215581086 U | 1/2022 |
| CN | 115133764 A | 9/2022 |

* cited by examiner

*Primary Examiner* — William Hernandez
(74) *Attorney, Agent, or Firm* — Crowe & Dunlevy LLC

(57) ABSTRACT

A pulse generator for generating the pulses setting an on-time utilized for switching a DC-DC converter includes a voltage divider having a tap at which a dithered reference voltage is produced, a voltage to current converter arrangement generating a charging current having a magnitude based upon the dithered reference voltage, a timing capacitor that is charged by the charging current, a reset switch for the timing capacitor, and a comparator generating a pulse based on a comparison between a timing voltage stored on the timing capacitor and a reference voltage, with a width of the pulse being set as a function of a rate of the charging of the timing capacitor by the charging current. The voltage divider is adjustable and incrementally changes a resistance seen at the tap of the voltage divider so that the dithered reference voltage is modulated in a stair-stepped triangular fashion.

17 Claims, 9 Drawing Sheets

DITHERING FOR CONSTANT ON TIME CONTROL LOOP

TECHNICAL FIELD

This disclosure is directed to a pulse generator for generating the on-time pulses utilized for switching a DC-DC converter operating using a constant on-time control loop, and in particular, to such a pulse generator design that effectuates dithering of the switching frequency of the DC-DC converter.

BACKGROUND

Switching systems, such as DC-DC converters, are known sources of electromagnetic noise, which can be detrimental to other electronic devices in the same environment. These emissions typically have a discrete spectrum, featuring power peaks at the harmonics of the switching frequency. To adhere to Electromagnetic Compatibility (EMC) standards like CISPR 22/25, these peaks must align with specific threshold masks.

There are various methods to minimize the amplitude of these peaks from a DC-DC converter. These include shielding and filtering techniques, which help reduce both emitted and radiated interference between the source (aggressor) and affected (victim) circuits.

One approach to enhance compliance with EMC standards involves redistributing the emitted noise across a broader frequency range. This may be achieved by slightly altering the switching frequency. This maintains the total emitted energy while lowering the intensity of individual peaks, making them less likely to interfere with nearby circuits. By doing so, the system can better coexist with other electronic devices, reducing the potential for harmful electromagnetic interference.

However, existing implementations of this approach suffer from drawbacks. One such implementation is shown in FIG. 1, showing a pulse generator 10 for generating the on-time $T_{ON}$ utilized for switching a DC-DC converter operating using a constant on-time (COT) control loop. The pulse generator 10, in particular, generates a charging current $I_{CHG}$ used to generate fixed width pulses setting the on-time $T_{ON}$. In greater detail, the pulse generator 10 includes a top resistor $R_{TOP}$ connected between an input voltage node $V_{IN}$ and node N1, and a bottom resistor $R_{BOT}$ connected between node N1 and ground. An amplifier 12 has its non-inverting input terminal connected to node N1, its inverting input terminal connected to node N2, and its output connected to the gate of n-channel transistor MN1. N-channel transistor MN1 has its drain connected to node N3 and its source connected to node N2. A resistor $R_{RON}$ is connected between node N2 and ground, with a voltage $V_{PAR}$ being formed at node N2. P-channel transistor MP1 has its source connected to a supply voltage node $V_{CC}$, its drain connected to node N3, and its gate connected to node N3. A variable p-channel transistor MP2 has its source connected to the supply voltage node $V_{CC}$, its drain connected to a signal generator 13, and its gate connected to node N3. The variable p-channel transistor MP2 is controlled by control circuitry 98.

Operation of the pulse generator 10 involves perturbing the charging current $I_{CHG}$ used to produce the pulses setting the on-time $T_{ON}$, with the aim of achieving a digital triangular modulation by perturbing the current with a known deviation of ±5% of $I_{CHG}$. In this design, the depicted variable transistor MP2 represents a multi-branch current mirror configured as a variable current source to generate the charging current $I_{CHG}$, with the current provided by the branches of the current mirror being weighted by powers of two. These branches are sequentially activated and deactivated.

The use of the pulse generator 10 in dithering the charging current $I_{CHG}$ used to produce the $T_{ON}$ pulse is effective in situations with a limited number of known switching frequencies. The charging current in this design is dependent on the input voltage, $V_{IN}$, and the external resistance $R_{RON}$, which is related to the output voltage to switching frequency ratio $$V_{OUT}/F_{SW}$$

of the converter. With a wide range of $V_{IN}$ and $R_{RON}$, $I_{CHG}$ can vary, ranging from hundreds of nA to hundreds of µA.

Designing a current mirror that maintains correct biasing and high accuracy across this entire range of current is challenging. Particularly at the lower end of the charging current $I_{CHG}$, the current mirror branches corresponding to the less significant bits can have currents as low as a few nanoamperes, which become comparable to the noise levels. Consequently, the dithering effect applied to the switching frequency $F_{SW}$ can become unstable, with variations in width, symmetry, and average value under different operating conditions. This instability can undermine the effectiveness of the dithering in spreading the electromagnetic emissions over a broader frequency spectrum and thus maintaining EMC compliance.

Given this, further development into techniques for redistributing the emitted noise across a broader frequency range is therefore needed.

SUMMARY

Disclosed herein is a pulse generator for generating the pulses setting an on-time $T_{ON}$ utilized for switching a DC-DC converter. The pulse generator includes: a voltage divider coupled between an input voltage and ground, with a dithered reference voltage being produced at a tap of the voltage divider; a voltage to current converter arrangement generating a charging current having a magnitude that is based upon the dithered reference voltage; a timing capacitor configured to be charged by the charging current; a reset switch configured to selectively discharge the timing capacitor; and a comparator configured to generate a pulse based on a comparison between a timing voltage stored on the timing capacitor and a reference voltage, with a width of the pulse being set as a function of a rate of the charging of the timing capacitor by the charging current; wherein the voltage divider is configured to incrementally change a resistance seen at the tap of the voltage divider so that the dithered reference voltage is modulated in a stair-stepped triangular fashion.

The voltage divider may include: a top resistor connected between the input voltage and the tap; a bottom resistor connected between the tap and a first switch configured to selectively couple the bottom resistor directly to ground or to ground through a second resistor; and an adjustable resistance connected between the tap and second switch configured to selectively couple the adjustable resistance to ground or allow the adjustable resistance to float, with incremental changes in a resistance value of the adjustable resistance producing the incremental change in the resistance seen at the tap.

The adjustable resistance may include: a plurality of resistors series connected between the tap and ground, with respective ones of a plurality of switches connected across corresponding ones of the plurality of resistors to selectively short different ones of the plurality of resistors.

The plurality of resistors may vary in resistance by powers of two.

The plurality of resistors may include: a first resistor connected between the tap and a first node; a second resistor connected between the first node and a second node; a third resistor connected between the second node and a third node; a fourth resistor connected between the third node and a fourth node; a fifth resistor connected between the fourth node and a fifth node; and a sixth resistor connected between the fifth node and a sixth node.

The plurality of switches may include: a third switch connected between the first node and the second node, the third switch operated by a fourth bit of a dither control word; a fourth switch connected between the second node and the third node, the fourth switch operated by a third bit of the dither control word; a fifth switch connected between the third node and the fourth node, the fifth switch operated by a second bit of the dither control word; a sixth switch connected between the fourth node and the fifth node, the sixth switch operated by a first bit of the dither control word; and a seventh switch connected between the fifth node and ground, the seventh switch operated by a zeroth bit of the dither control word. The second switch is connected between the sixth node and ground. Control circuitry is configured to periodically increment the dither control word from a first binary value to a second binary value, and once the dither control word has reached the second binary value, periodically decrement the dither control word from the second binary value back to the first binary value.

A resistance of the second resistor may be equal to sixteen times a base resistance value, a resistance of the third resistor may be equal to eight times the base resistance value, a resistance of the fourth resistor may be equal to four times the base resistance value, a resistance of the fifth resistor may be equal to two times the base resistance value, and a resistance of the sixth resistor may be equal to the base resistance value.

The plurality of resistors may include: a first resistor connected between the tap and a first node; a second resistor connected between the first node and a second node; a third resistor connected between the second node and a third node; a fourth resistor connected between the third node and a fourth node; a fifth resistor connected between the fourth node and a fifth node; a sixth resistor connected between the fifth node and a sixth node; a seventh resistor connected between the sixth node and a seventh node; an eighth resistor connected between the seventh node and an eighth node; a ninth resistor connected between the eighth node and a ninth node; and a tenth resistor connected between the ninth node and a tenth node.

The plurality of switches may include: a third switch connected between the first node and the second node, the third switch operated by a logical AND between a third bit and a fourth bit of a dither control word; a fourth switch connected between the second node and the third node, the fourth switch operated by a logical AND between a second bit and the fourth bit of the dither control word; a fifth switch connected between the third node and the fourth node, the fifth switch operated by a logical AND between a first bit and the fourth bit of the dither control word; a sixth switch connected between the fourth node and the fifth node, the sixth switch operated by a logical AND between a zeroth bit and the fourth bit of the dither control word; a seventh switch connected between the fifth node and a sixth node, the seventh switch operated by the fourth bit of the dither control word; an eighth switch connected between the sixth node and the seventh node, the eighth switch operated by a logical OR between the third bit and fourth bit of the dither control word; a ninth switch connected between the seventh node and the eighth node, the ninth switch operated by a logical OR between the second bit and fourth bit of the dither control word; a tenth switch connected between the eighth node and the ninth node, the tenth switch operated by a logical OR between the first bit and fourth bit of the dither control word; and an eleventh switch connected between the ninth node and the tenth node, the eleventh switch operated by a logical OR between the zeroth bit and fourth bit of the dither control word. The second switch may be connected between the tenth node and ground. Control circuitry may be configured to periodically increment the dither control word from a first binary value to a second binary value, and once the dither control word has reached the second binary value, periodically decrement the dither control word from the second binary value back to the first binary value.

A resistance of the second resistor may be equal to eight times a base resistance value, a resistance of the third resistor may be equal to four times the base resistance value, a resistance of the fourth resistor may be equal to two times the base resistance value, a resistance of the fifth resistor may be equal to the base resistance value, a resistance of the sixth resistor may be equal to four times the base resistance value, a resistance of the seventh resistor may be equal to sixteen times the base resistance value, a resistance of the eighth resistor may be equal to eight times the base resistance value, a resistance of the ninth resistor may be equal to four times the base resistance value, and a resistance of the tenth resistor may be equal to two times the base resistance value.

The first transistor may be a first transistor having a first conduction terminal connected to a third node, a second conduction terminal connected to a second node, and a control terminal coupled to the gate drive voltage. The current mirror may include: a second transistor having a first conduction terminal coupled to a first given voltage, a second conduction terminal connected to the third node, and a control terminal connected to the third node; and a third transistor having a first conduction terminal coupled to the first given voltage, a second conduction terminal connected to the timing capacitor, and a control terminal connected to the third node.

The first amplifier may have a first coupled to the tap to receive the dithered reference voltage, a second input coupled to the second node, and an output coupled to the control terminal of the first transistor. A sense resistor may be connected between the second node and a second given voltage.

The voltage to current converter arrangement may include: a first transistor configured to generate a first current based upon a gate drive voltage; a first amplifier configured to generate and modulate the gate drive voltage based on a comparison between the dithered reference voltage and a feedback voltage representative of the first current; and a current mirror configured to mirror the first current to produce the charging current.

Also disclosed herein is a method for generating pulses that set an on-time for switching a DC-DC converter. The method includes: generating a dithered reference voltage by incrementally changing a resistance seen at a tap of a voltage divider so that the dithered reference voltage is modulated in a stair-stepped triangular fashion; generating a charging current having a magnitude that is based upon the dithered reference voltage; receiving the charging current at a timing capacitor so that the charging current charges the timing capacitor; and comparing a voltage across the timing capacitor to a non-dithered reference voltage and asserting or deasserting a pulse based upon the comparison, with a width of the pulse being set as a function of a rate of the charging of the timing capacitor by the charging current.

The resistance seen at the tap of the voltage divider may be incrementally changed by: selectively shorting different ones of a plurality of resistors series connected between the tap and ground by closing respective ones of a plurality of switches connected across corresponding ones of the plurality of resistors.

The plurality of resistors may vary in resistance by powers of two.

Each of the plurality of switches may be closed in response to assertion of a different bit of a dither control word.

Each of a first subset of the plurality of switches may be closed in response to a result of a logical AND operation between two different bits of a dither control word, and each of a second subset of the plurality of switches may be closed in response to a result of a logical OR operation between two different bits of the dither control word.

A remaining one of the plurality of switches that is not within the first subset or the second subset may be closed in response to assertion of one of the bits of the dither control word.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 2:
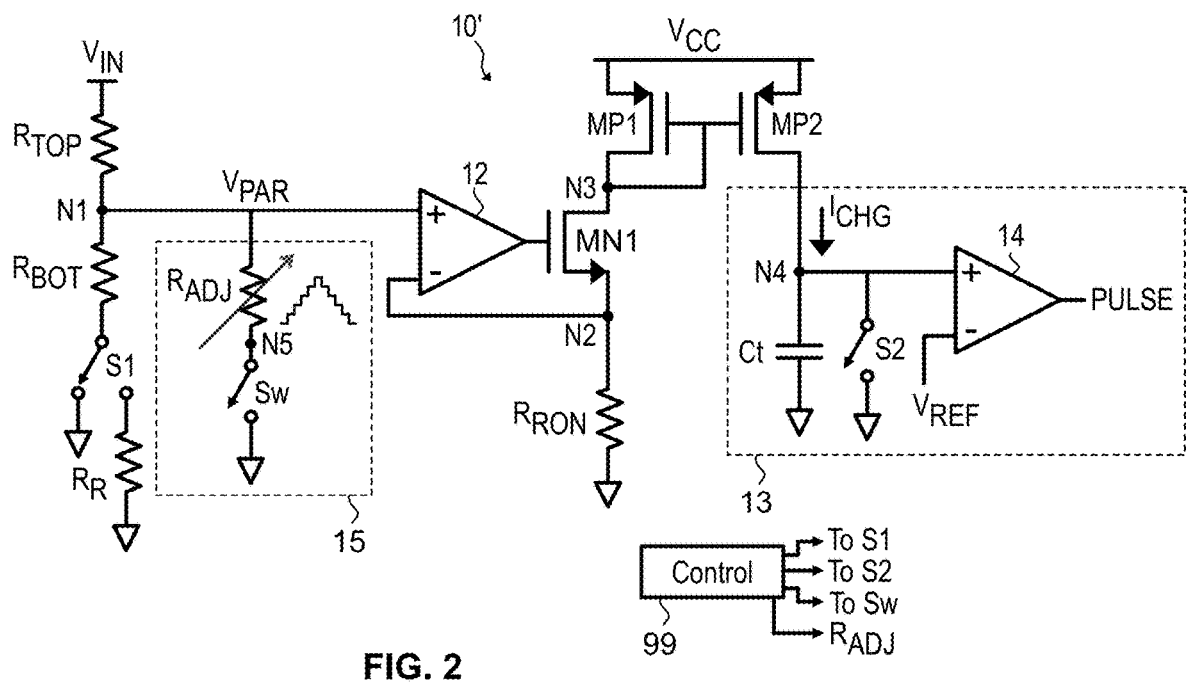
FIG. 2 is a schematic block diagram of a genericized version of a pulse generator disclosed herein for generating the on-time pulses utilized for switching a DC-DC converter operating using a constant on-time control loop.

Now described with reference to FIG. 2 is a pulse generator 10' for generating the pulses setting the on-time $T_{ON}$ utilized for switching a DC-DC converter operating using a constant on-time (COT) control loop. The pulse generator 10' includes a top resistor $R_{TOP}$ connected between an input voltage node $V_{IN}$ and node N1, and a bottom resistor $R_{BOT}$ connected between node N1 and a switch S1. The switch S1 selectively connects the bottom resistor $R_{BOT}$ either to ground or to a resistor $R_R$, which is connected between switch S1 and ground. A dither circuit 15 is formed by adjustable resistance $R_{ADJ}$ connected between node N1 and node N5, and switch Sw is connected between node N5 and ground. A dithered reference voltage $V_{PAR}$ is formed at node N1 during operation.

An amplifier 12 has its non-inverting input terminal connected to node N1, its inverting input terminal connected to node N2, and its output connected to the gate of n-channel transistor MN1. N-channel transistor MN1 has its drain connected to node N3 and its source connected to node N2. A resistor $R_{RON}$ is connected between node N2 and ground, with a voltage $V_{PAR}$ being formed at node N2; note that resistor $R_{RON}$ may be a discrete external component and that N2 may be the pin to which it is connected, permitting selection of the resistance used to match the application, or that resistor $R_{RON}$ may be an adjustable internal resistance that is changed through an externally received control signal. P-channel transistor MP1 has its source connected to a supply voltage node $V_{CC}$, its drain connected to node N3, and its gate connected to node N3. A p-channel transistor MP2 has its source connected to the supply voltage node $V_{CC}$, its drain connected to a signal generator 13, and its gate connected to node N3.

The signal generator 13 includes node N4 connected to the drain of p-channel transistor MP2 to receive the charging current $I_{CHG}$, with a timing capacitor Ct connected between node N4 and ground. Switch S2 is connected between node N4 and ground. A comparator 14 has its non-inverting input terminal connected to node N4 to receive the voltage across timing capacitor Ct and has its inverting input terminal coupled to a reference voltage $V_{REF}$. The pulses PULSE defining the end of the on-time $T_{ON}$ are generated at the output of the comparator 14.

Control circuitry 99 operates the switches S1, S2, Sw, and adjusts the resistance of the adjustable resistance $R_{ADJ}$.

In operation, the comparator 14 compares the voltage across Ct to the reference voltage $V_{REF}$, and when the voltage across capacitor Ct is greater than the reference voltage $V_{REF}$, the output PULSE of the comparator 14 is asserted to a logic high, while when the voltage across capacitor Ct is less than the reference voltage $V_{REF}$, the output PULSE of the comparator 14 is deasserted to a logic low. Capacitor Ct is charged by the current $I_{CHG}$. Therefore, the greater the current $I_{CHG}$, the quicker capacitor Ct is charged, and the shorter the on-time $T_{ON}$ set by the output PULSE of the comparator 14; the less the current $I_{CHG}$, the more slowly capacitor Ct is charged, and the longer the on-time $T_{ON}$ set by the output PULSE of the comparator 14.

The arrangement of the amplifier 12 acts as a voltage to current converter, and drives transistor MN1 such that the voltage at node N2 is equal to the reference voltage $V_{PAR}$; thus, the dithered reference voltage $V_{PAR}$ sets the amplitude of the drain current of MN1, which is mirrored by the current mirror arrangement of transistors MP1 and MP2 to produce the current $I_{CHG}$ that charges capacitor Ct. Thus, the magnitude of the current $I_{CHG}$ is set by the dithered reference voltage $V_{PAR}$.

The dithered reference voltage $V_{PAR}$ is dithered by periodically changing the resistance of the voltage divider formed by the top resistor $R_{TOP}$, the bottom resistor $R_{BOT}$, and the adjustable resistance $R_{ADJ}$. To perform dithering, the control circuitry 99 sets switch S1 to connect the bottom resistor $R_{BOT}$ between node N1 and ground, sets switch Sw to connect the adjustable resistance $R_{ADJ}$ between node N1 and ground, and periodically adjusts the resistance of the adjustable resistance $R_{ADJ}$ such so that the resistance of the parallel combination of the bottom resistor $R_{BOT}$ and the adjustable resistance $R_{ADJ}$ results in stair-stepped triangular modulation of the reference voltage $V_{PAR}$. The dithered reference voltage $V_{PAR}$ can be calculated as $$V_{PAR} = \frac{R_{BOTTOM}}{R_{TOP} + R_{BOTTOM}}.$$

$V_{IN}$, where $R_{BOTTOM}$ is the parallel combination of $R_{BOT}$ and $R_{ADJ}$.

Figure 1:
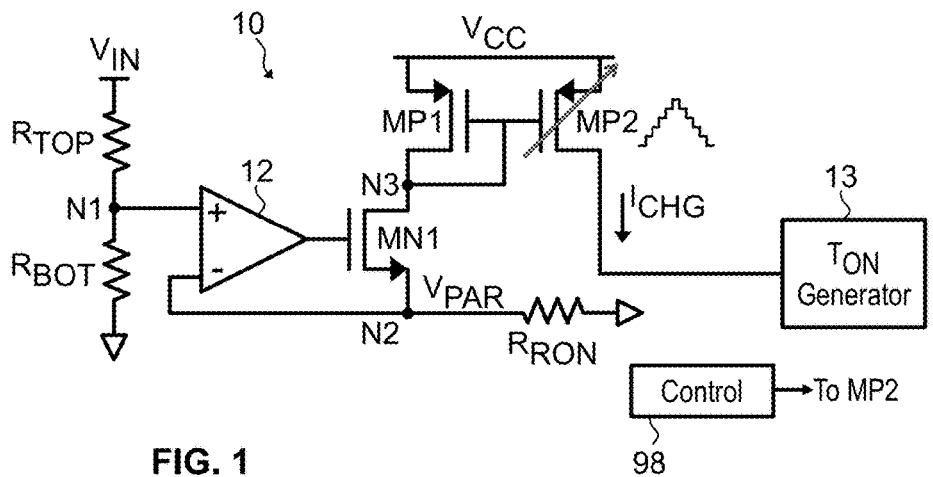
FIG. 1 is a schematic block diagram of a known pulse generator for generating the on-time pulses utilized for switching a DC-DC converter operating using a constant on-time control loop.

The advantage with respect to the embodiment of FIG. 1 is that depending on ratio of $R_{BOT}$ and $R_{TOP}$, and on the variation in $V_{IN}$, an assumption can be made that $V_{PAR}$ can vary as well. However, if the divider formed by $R_{BOT}$ and $R_{TOP}$ is correctly dimensioned, $V_{PAR}$ could vary between hundreds of mV to less than 2V, so the worst case is a one order of magnitude variation as opposed to the three order of magnitude variation possible with the embodiment of FIG. 1.

The switch S1 facilitates the modulation of the dithered reference voltage $V_{PAR}$ by connecting $R_{BOT}$ to ground and, optionally depending on the dimensioning of $R_{BOT}$, to $R_R$. When $R_{BOT}$ is connected directly to ground during dithering, it forms the lowest possible resistance state in the divider, creating the lowest reference point in the stair-stepped voltage profile. Conversely, when $R_{BOT}$ is left floating (or is connected to $R_R$), it effectively increases the resistance in the lower segment of the voltage divider, raising the voltage at node N1 to a higher step in the profile.

The stair stepped dithering of the dithered reference voltage $V_{PAR}$ spreads the spectral content of the noise emitted by a DC-DC converter employing the pulse generator 10' over a broader frequency range, thereby reducing the peak intensity of the emitted noise at any given frequency.

Figure 3:
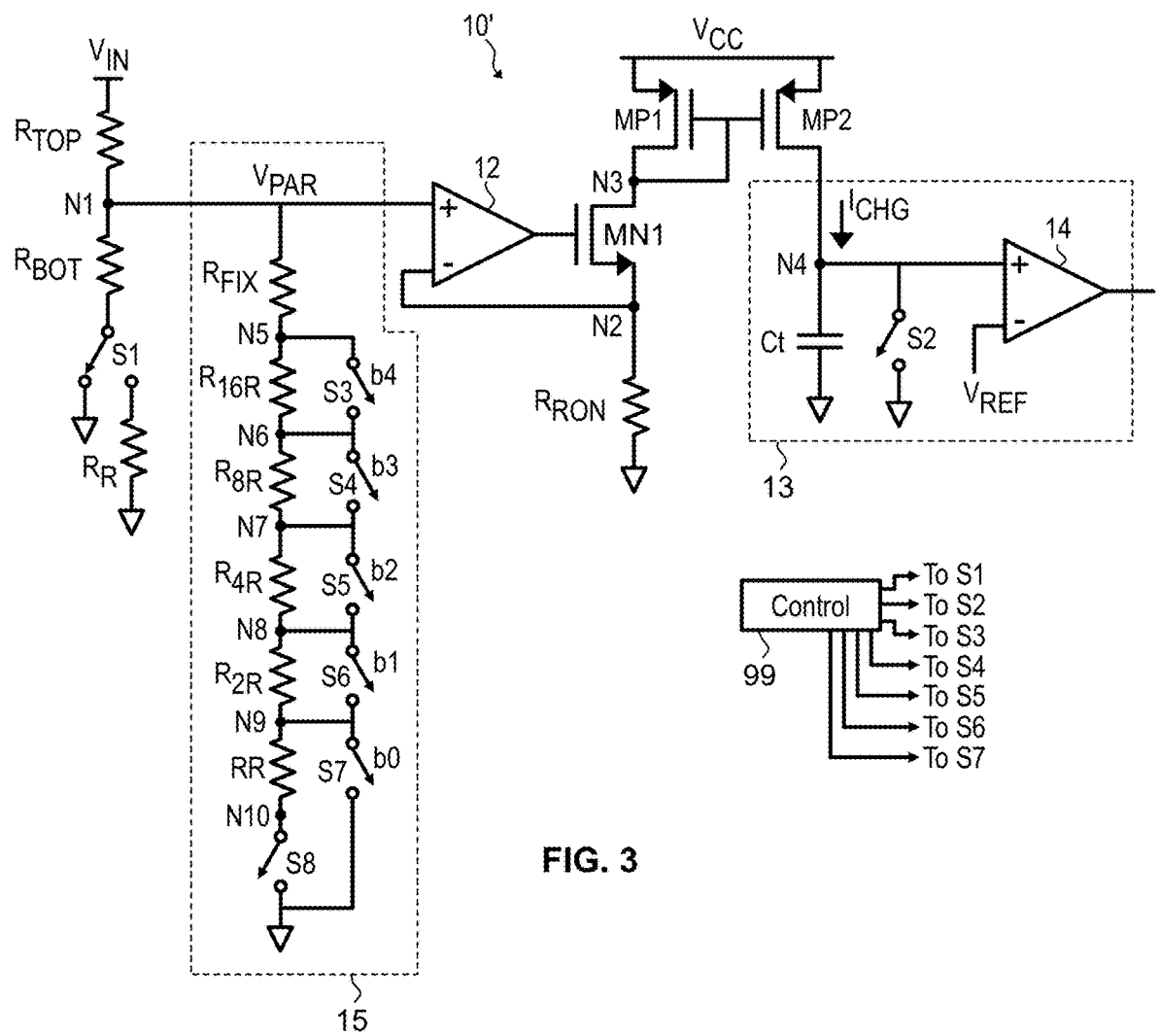
FIG. 3 is a schematic block diagram of a first pulse generator disclosed herein for generating the pulses setting the on-time utilized for switching a DC-DC converter operating using a constant on-time control loop.

Now described with reference to FIG. 3 is a version of the pulse generator 10' in which a first embodiment of the dither circuit 15 is shown. Here, a dither control word (formed by bits b0, b1, b2, b3, b4) is generated by the control circuitry 99. The dither circuit 15 includes resistor $R_{FIX}$ connected between node N1 and node N5, resistor $R_{16R}$ (having a resistance of 16 RΩ) connected between node N5 and node N6, resistor $R_{8R}$ (having a resistance of 8 RΩ) connected between node N6 and node N7, resistor $R_{4R}$ (having a resistance of 4 RΩ) connected between node N7 and node N8, resistor $R_{2R}$ (having a resistance of 2 RΩ) connected between node N8 and node N9, resistor RR (having a resistance of RΩ) connected between node N9 and node N10, and switch S8 connected between node N10 and ground. A switch S3 (controlled by bit b4 of a dither control word) is connected between node N5 and N6, a switch S4 (controlled by bit b3 of the dither control word) is connected between node N6 and N7, a switch S5 (controlled by bit b2 of the dither control word) is connected between node N7 and N8, a switch S6 (controlled by bit b1 of the dither control word) is connected between node N8 and N9, and a switch S7 (controlled by bit b0 of the dither control word) is connected between node N9 and ground.

Figure 4:
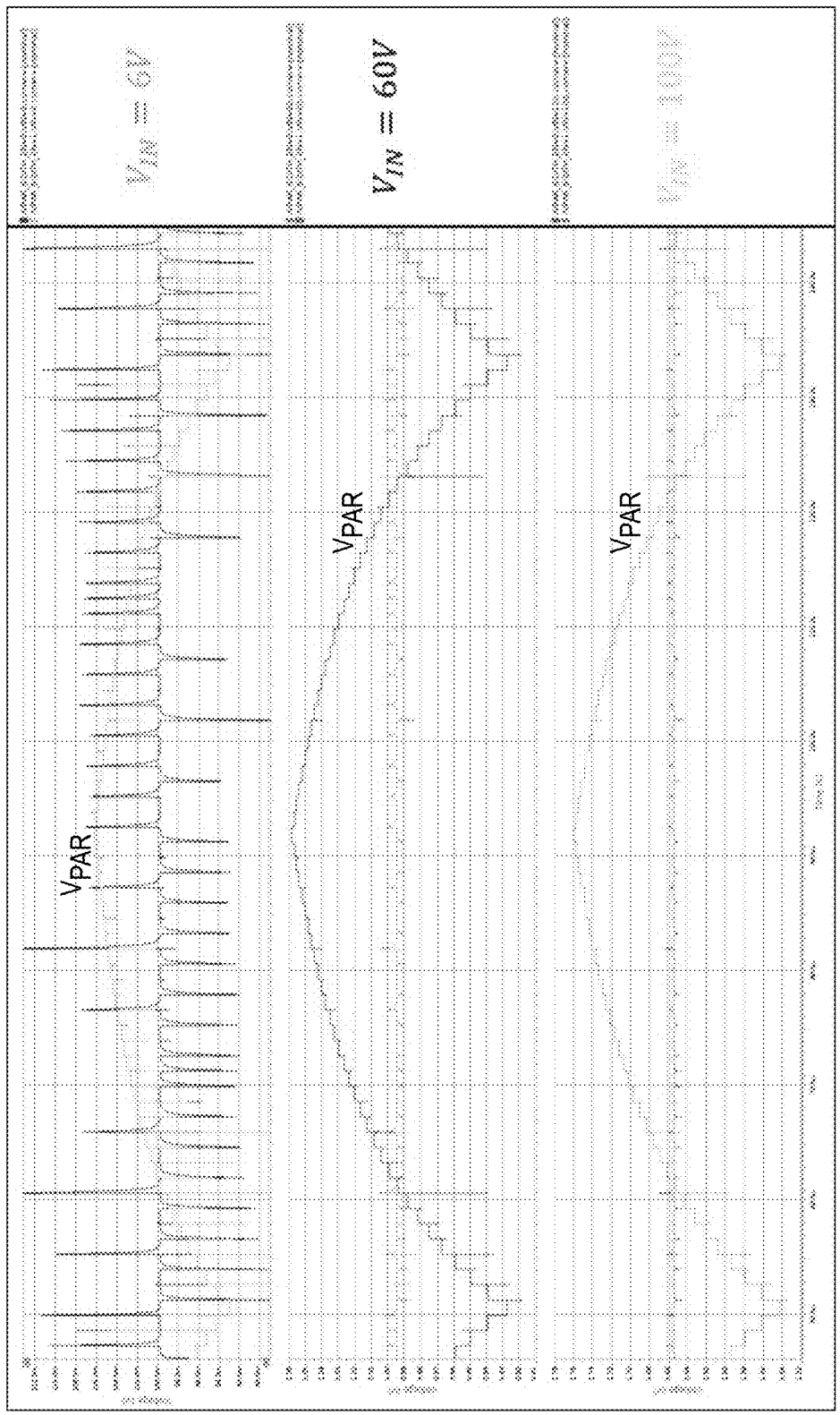
FIG. 4 includes a series of graphs showing the input voltage and the dithered reference voltage ($V_{PAR}$) of the design of FIG. 3 in operation.

In operation, the dither control word is incremented from a binary 0 (b0000) to a binary 15 (b1111), and then from binary 15 back to binary 0, selectively shorting ones of resistors $R_{16R}$, $R_{8R}$, $R_{4R}$, $R_{2R}$, RR, forming the reference voltage $V_{PAR}$ shape shown in FIG. 4.

As can be observed, the reference voltage $V_{PAR}$ shape achieved using the dither circuit 15 of FIG. 3 is not a perfect stair-stepped triangular shape and is more of a stair-stepped inverted paraboloid shape. As such, the spectral spread of the noise content may be insufficient for certain applications (but entirely sufficient for others).

Figure 5:
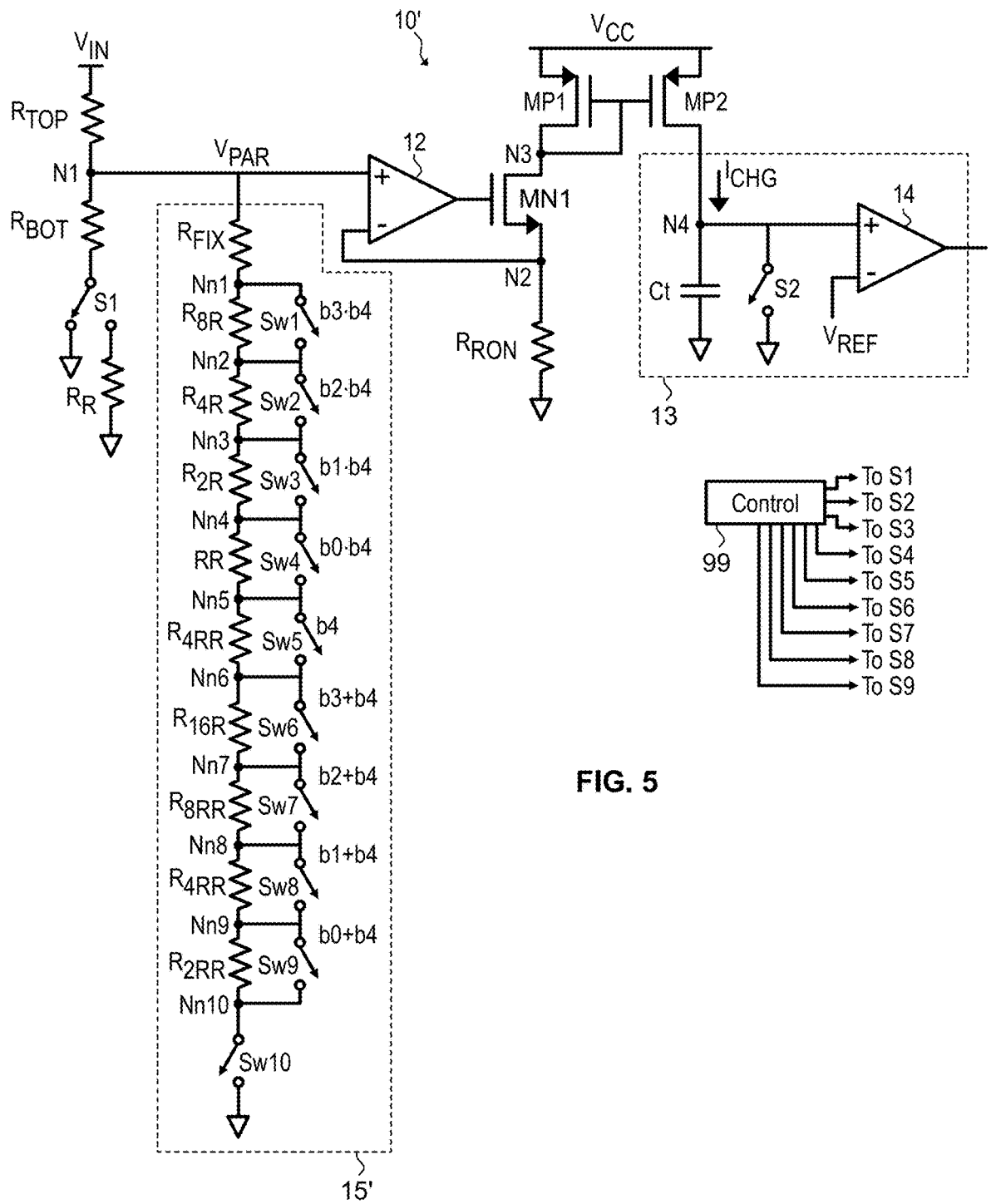
FIG. 5 is a schematic block diagram of a second pulse generator disclosed herein for generating the pulses setting the on-time utilized for switching a DC-DC converter operating using a constant on-time control loop.

For instances where the specific application calls for a greater spectral spread of noise content, the embodiment of FIG. 5 may be utilized. Shown in FIG. 5 is a version of the pulse generator 10' in which a second embodiment of the dither circuit 15' is shown. Here, the dither circuit 15' includes resistor $R_{FIX}$ connected between node N1 and node Nn1, resistor $R_{8R}$ (having a resistance of 8 RΩ) connected between node Nn1 and node Nn2, resistor $R_{4R}$ (having a resistance of 4 RΩ) connected between node Nn2 and node Nn3, resistor $R_{2R}$ (having a resistance of 2 RΩ) connected between node Nn3 and node Nn4, resistor RR having a resistance of RΩ) connected between node Nn4 and node Nn5, resistor $R_{4RR}$ (having a resistance of 4 RΩ) connected between node Nn5 and node Nn6, resistor $R_{16R}$ (having a resistance of 16 RΩ) connected between node Nn6 and node Nn7, resistor $R_{8RR}$ (having a resistance of 8 RΩ) connected between node Nn7 and node Nn8, resistor $R_{4RR}$ (having a resistance of 4 RΩ) connected between node Nn8 and node Nn9, resistor $R_{2RR}$ (having a resistance of 2 RΩ) connected between node Nn6 and node Nn10, and switch Sw10 connected between node Nn10 and ground.

A switch Sw1 (controlled by a logical AND of bit b3 and bit b4 of the dither control word) is connected between node Nn1 and Nn2, a switch Sw2 (controlled by a logical AND of bit b2 and bit b4 of the dither control word) is connected between node Nn2 and Nn3, a switch Sw3 (controlled by a logical AND of bit bland bit b4 of the dither control word) is connected between node Nn3 and Nn4, a switch Sw4 (controlled by a logical AND of bit b0 and bit b4 of the dither control word) is connected between node Nn4 and Nn5, a switch Sw5 (controlled by bit b4 of the dither control word) is connected between node Nn5 and node Nn6, switch Sw6 (controlled by a logical OR of bit b3 and bit b4 of the dither control word) is connected between node Nn6 and Nn7, switch Sw7 (controlled by a logical OR of bit b2 and bit b4 of the dither control word) is connected between node Nn7 and Nn8, switch Sw8 (controlled by a logical OR of bit b1 and bit b4 of the dither control word) is connected between node Nn8 and Nn9, and switch Sw9 (controlled by a logical OR of bit b0 and bit b4 of the dither control word) is connected between node Nn9 and Nn10.

In operation here, other than resistor $R_{4RR}$ (which is selectively shorted by assertion of bit b4 of the dither control word), ones of the resistors $R_{8R}$, $R_{4R}$, $R_{2R}$, $R_R$, $R_{4RR}$, $R_{16R}$, $R_{8RR}$, $R_{4RR}$, and $R_{2RR}$ are selectively shorted by logical combinations of the bits b0, b1, b2, b3, b4 of the dither control word. Namely, $R_{8R}$ is selectively shorted by a logical AND between bits b3 and b4, $R_{4R}$ is selectively shorted by a logical AND between bits b2 and b4, $R_{2R}$ is selectively shorted by a logical AND between bits b1 and b4, $R_R$ is selectively shorted by a logical AND between bits b0 and b4, $R_{16R}$ is selectively shorted by a logical OR between bits b3 and b4, $R_{8RR}$ is selectively shorted by a logical OR between bits b2 and b4, $R_{4RR}$ is selectively shorted by a logical OR between bits b1 and b4, and $R_{2RR}$ is selectively shorted by a logical OR between bits b0 and b4.

Figure 6:
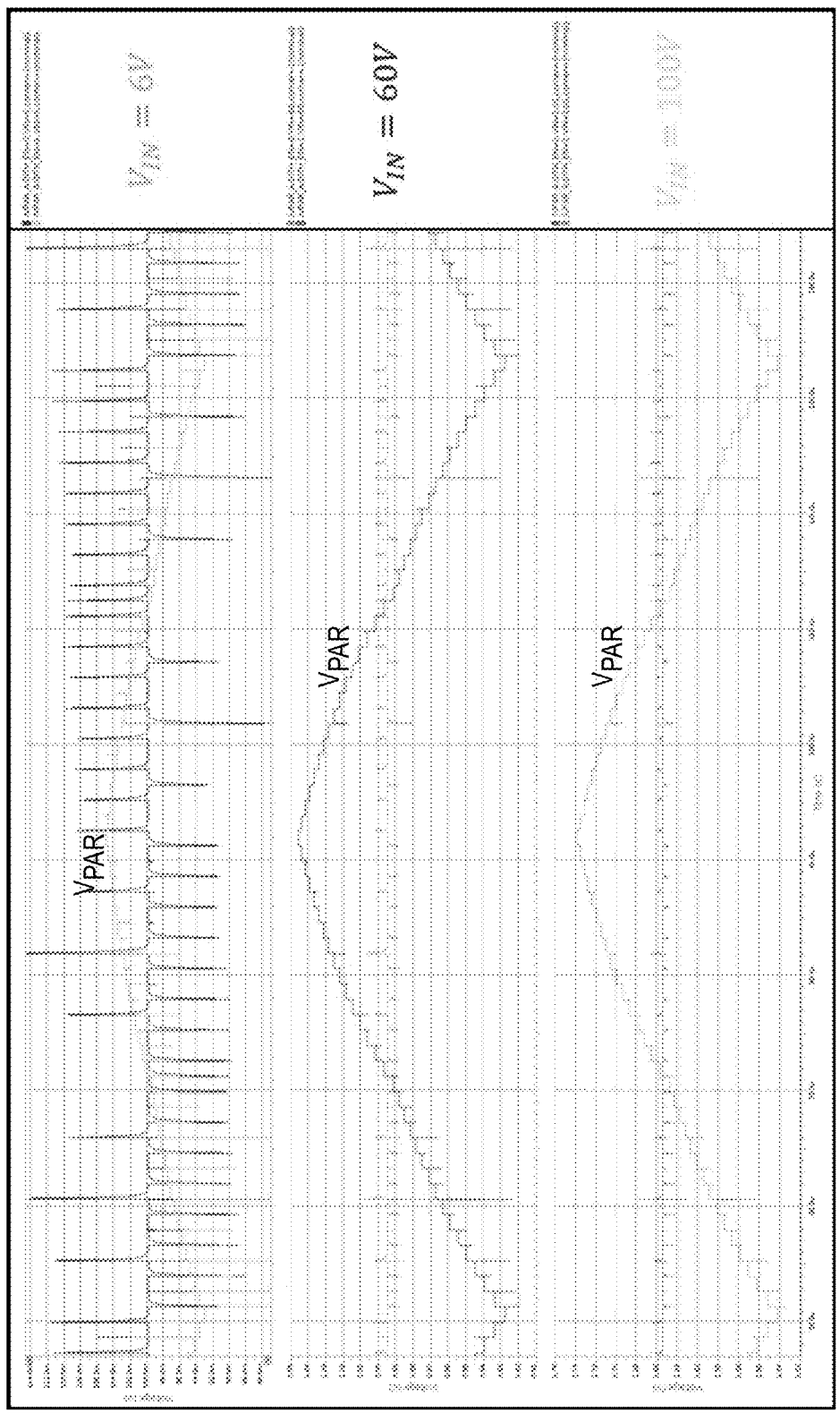
FIG. 6 includes a series of graphs showing the input voltage ($V_{IN}$) and the dithered reference voltage ($V_{PAR}$) of the design of FIG. 5 in operation.
Figure 7:
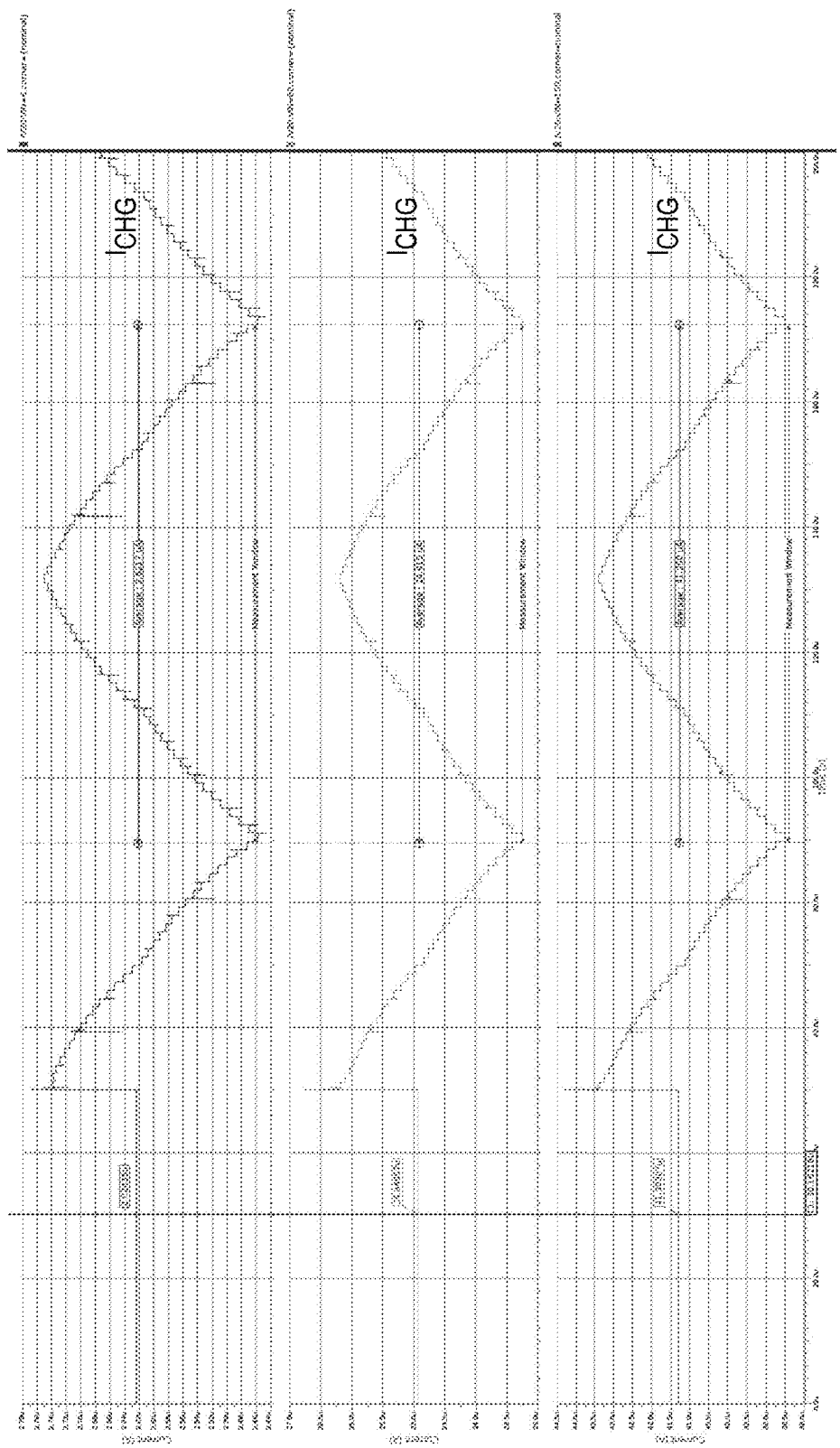
FIG. 7 includes a series of graphs showing the charging current ($I_{CHG}$) and the dithered reference voltage ($V_{PAR}$) of the design of FIG. 5 in operation.
Figure 8:
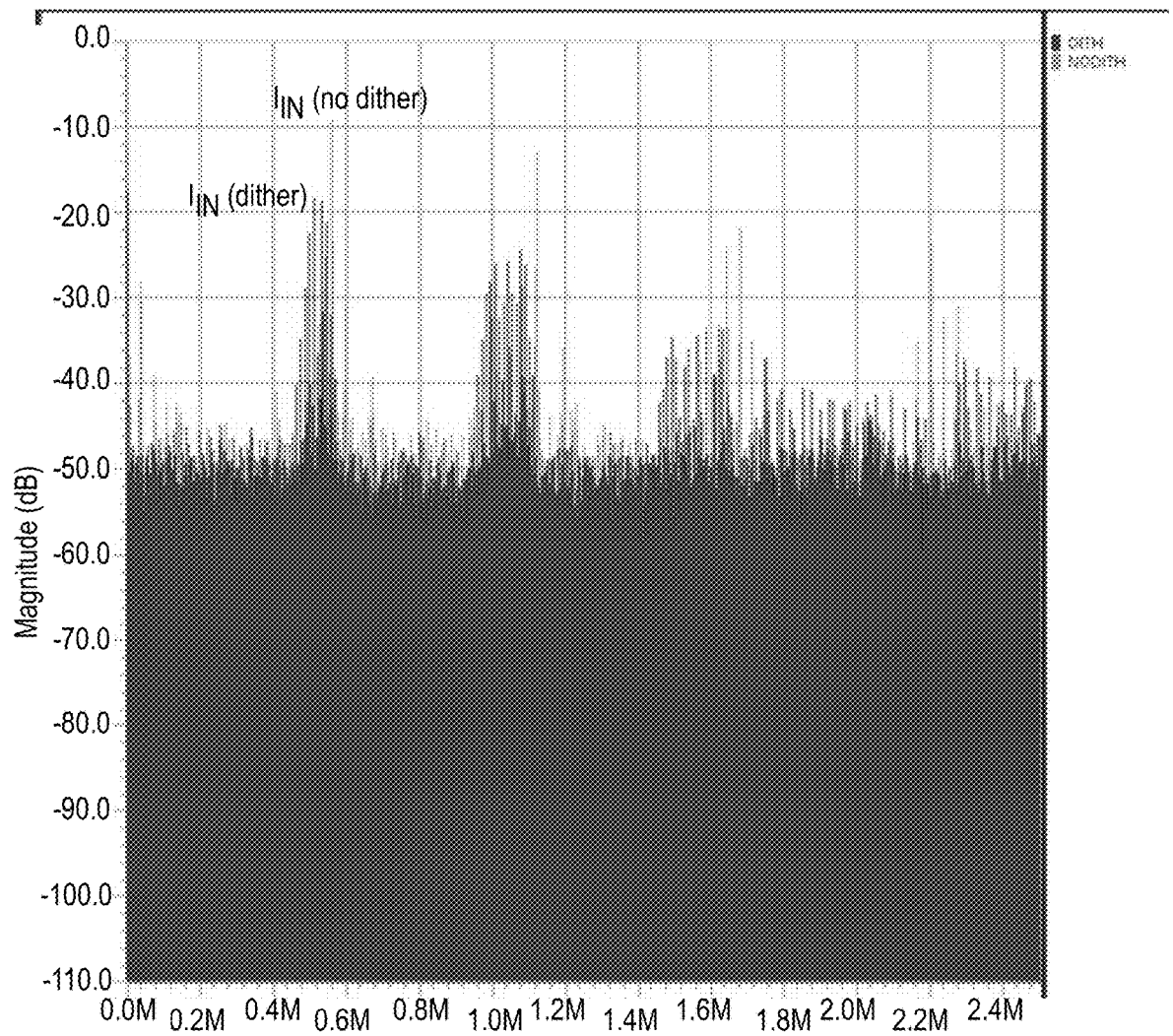
FIG. 8 is a graph showing the power spectrum of the input current of a DC-DC converter utilizing the pulse generator of FIG. 5 with dither activated and with dither deactivated.
Figure 9:
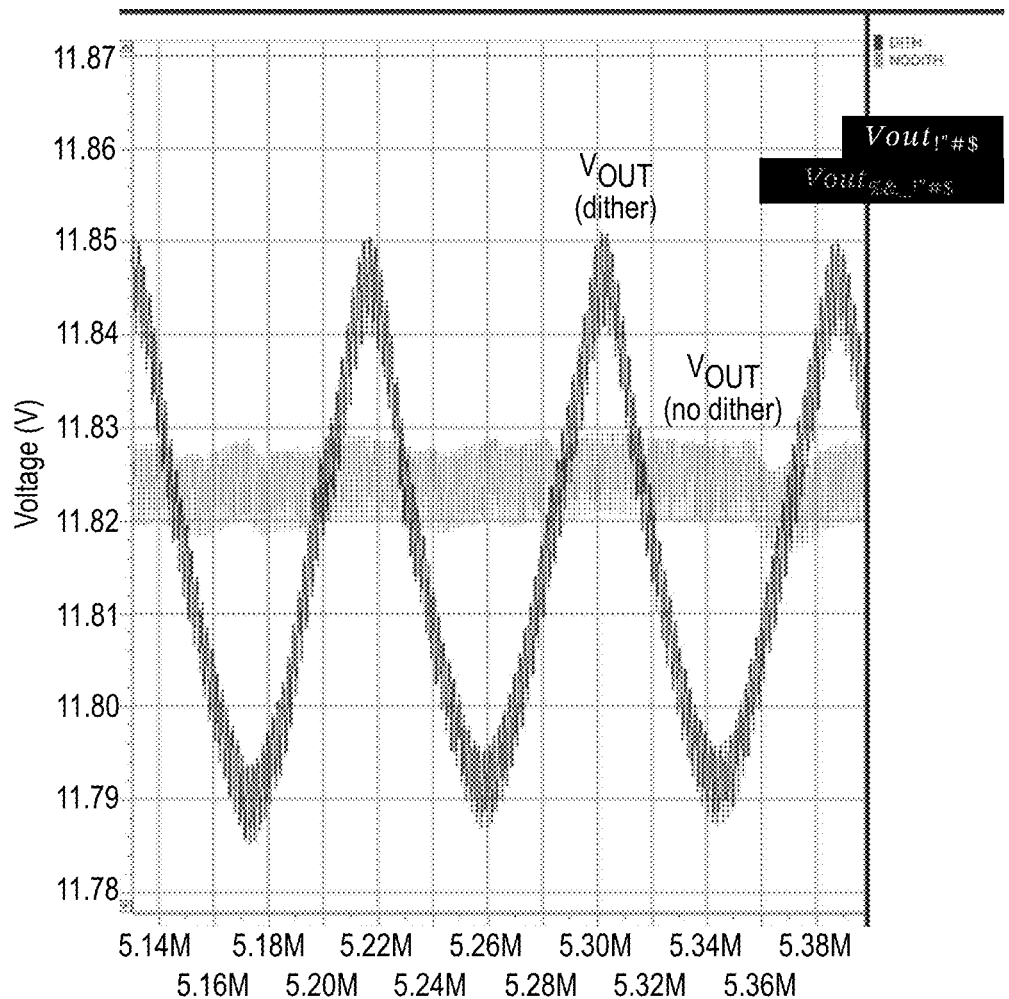
FIG. 9 is a graph showing the power spectrum of the output voltage of a DC-DC converter utilizing the pulse generator of FIG. 5 with dither activated and with dither deactivated.

This forms the reference voltage $V_{PAR}$ shape shown in FIG. 6. As can be observed, the reference voltage $V_{PAR}$ shape achieved using the dither circuit 15' of FIG. 5 is closer to a perfect stair-stepped triangular shape. As such, the spectral spread of the noise content is improved over the embodiment of FIG. 3, and is suitable for a wide range of applications. This embodiment also achieves a similar shape in the current $I_{CHG}$, as shown in FIG. 7. Shown in FIG. 8 is how the power spectrum of the input current $I_{IN}$ to the DC-DC converter utilizing the pulse generator 10' and dither circuit 15' is lowered by approximately 10 db utilizing dithering. Shown in FIG. 9 is the effect of the dithering on the output voltage $V_{OUT}$ to the DC-DC converter, namely the presence of a ripple with a frequency corresponding to the dithering modulation frequency.

Figure 10:
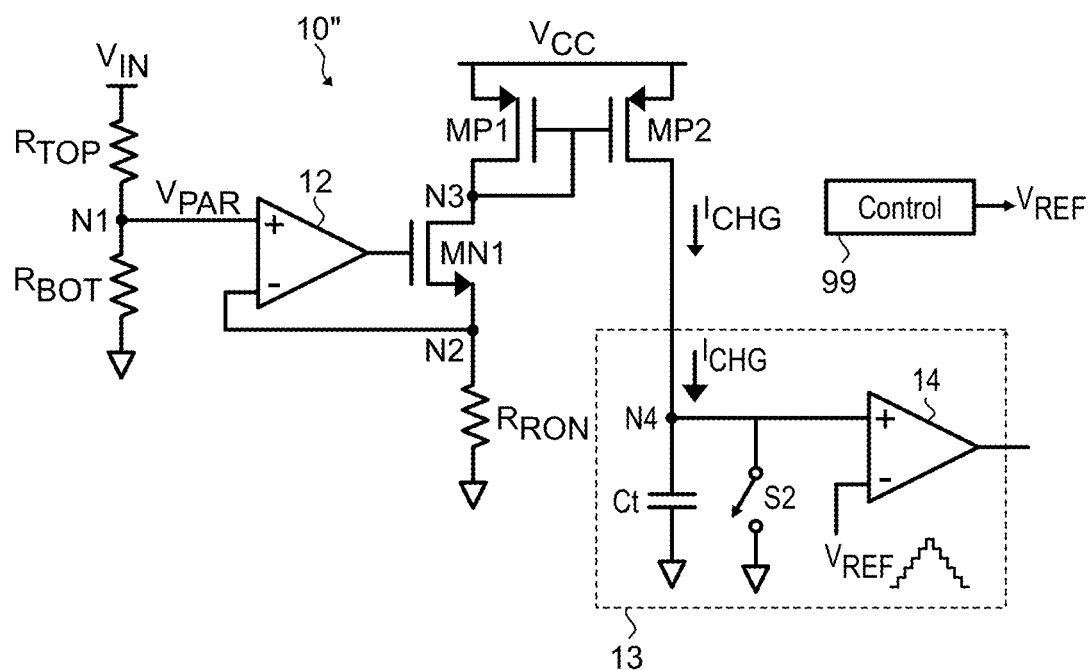
FIG. 10 is a schematic block diagram of a third pulse generator disclosed herein for generating the pulses setting the on-time utilized for switching a DC-DC converter operating using a constant on-time control loop.

It is evident that modifications and variations can be made to what has been described and illustrated herein without departing from the scope of this disclosure. For example, now described with reference to FIG. 10 is a pulse generator 10" for generating the pulses setting the on-time $T_{ON}$ utilized for switching a DC-DC converter operating using a constant on-time (COT) control loop.

The pulse generator 10" includes a top resistor $R_{TOP}$ connected between an input voltage node $V_{IN}$ and node N1, and a bottom resistor $R_{BOT}$ connected between node N1 and ground. An amplifier 12 has its non-inverting input terminal connected to node N1, its inverting input terminal connected to node N2, and its output connected to the gate of n-channel transistor MN1. N-channel transistor MN1 has its drain connected to node N3 and its source connected to node N2. A resistor $R_{RON}$ is connected between node N2 and ground, with a voltage $V_{PAR}$ being formed at node N2. P-channel transistor MP1 has its source connected to a supply voltage node $V_{CC}$, its drain connected to node N3, and its gate connected to node N3. A p-channel transistor MP2 has its source connected to the supply voltage node $V_{CC}$, its drain connected to a signal generator 13, and its gate connected to node N3.

The signal generator 13 includes node N4 connected to the drain of p-channel transistor MP2 to receive the charging current $I_{CHG}$, with a timing capacitor Ct connected between node N4 and ground. Switch S2 is connected between node N4 and ground. A comparator 14 has its non-inverting input terminal connected to node N4 to receive the voltage across timing capacitor Ct and has its inverting input terminal coupled to a dithered reference voltage $V_{REF}$. The clock pulses PULSE setting the on-time $T_{ON}$ are generated at the output of the comparator 14.

Note the dithered reference voltage $V_{REF}$ utilized here, as opposed to the dithered reference voltage $V_{PAR}$. This is implemented utilizing an analog multiplexer that sequentially selects a value on a voltage divider applied to a bandgap voltage. However, at each changing of the value of the dithered reference voltage $V_{REF}$, noise is injected through the comparator, which may produce undesired effects.

It is to be appreciated that the techniques of FIGS. 2-3 may also be applied to embodiments where the dithering is instead performed by varying the connections of the resistor $R_{TOP}$.

In conclusion, although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A pulse generator for generating pulses setting an on-time utilized for switching a DC-DC converter, the pulse generator comprising:
    a voltage divider coupled between an input voltage and ground, with a dithered reference voltage being produced at a tap of the voltage divider;
    a voltage to current converter arrangement generating a charging current having a magnitude that is based upon the dithered reference voltage;
    a timing capacitor configured to be charged by the charging current;
    a reset switch configured to selectively discharge the timing capacitor; and
    a comparator configured to generate a pulse based on a comparison between a timing voltage stored on the timing capacitor and a reference voltage, with a width of the pulse being set as a function of a rate of the charging of the timing capacitor by the charging current;
    wherein the voltage divider is configured to incrementally change a resistance seen at the tap of the voltage divider so that the dithered reference voltage is modulated in a stair-stepped triangular fashion.

2. The pulse generator of claim 1, wherein the voltage divider comprises:
    a top resistor connected between the input voltage and the tap;
    a bottom resistor connected between the tap and a first switch configured to selectively couple the bottom resistor directly to ground or to ground through an additional resistor; and
    an adjustable resistance connected between the tap and a second switch configured to selectively couple the adjustable resistance to ground or allow the adjustable resistance to float, with incremental changes in a resistance value of the adjustable resistance producing the incremental change in the resistance seen at the tap.

3. The pulse generator of claim 2, wherein the adjustable resistance comprises:
a plurality of resistors series connected between the tap and ground, with respective ones of a plurality of switches connected across corresponding ones of the plurality of resistors to selectively short different ones of the plurality of resistors.

4. The pulse generator of claim 3, wherein the plurality of resistors vary in resistance by powers of two.

5. The pulse generator of claim 3,
wherein the plurality of resistors comprise:
a first resistor connected between the tap and a first node;
a second resistor connected between the first node and a second node;
a third resistor connected between the second node and a third node;
a fourth resistor connected between the third node and a fourth node;
a fifth resistor connected between the fourth node and a fifth node; and
a sixth resistor connected between the fifth node and a sixth node;
wherein the plurality of switches comprise:
a third switch connected between the first node and the second node, the third switch operated by a fourth bit of a dither control word;
a fourth switch connected between the second node and the third node, the fourth switch operated by a third bit of the dither control word;
a fifth switch connected between the third node and the fourth node, the fifth switch operated by a second bit of the dither control word;
a sixth switch connected between the fourth node and the fifth node, the sixth switch operated by a first bit of the dither control word; and
a seventh switch connected between the fifth node and ground, the seventh switch operated by a zeroth bit of the dither control word;
wherein the second switch is connected between the sixth node and ground; and
further comprising control circuitry configured to periodically increment the dither control word from a first binary value to a second binary value, and once the dither control word has reached the second binary value, periodically decrement the dither control word from the second binary value back to the first binary value.

6. The pulse generator of claim 5, wherein a resistance of the second resistor is equal to sixteen times a base resistance value, a resistance of the third resistor is equal to eight times the base resistance value, a resistance of the fourth resistor is equal to four times the base resistance value, a resistance of the fifth resistor is equal to two times the base resistance value, and a resistance of the sixth resistor is equal to the base resistance value.

7. The pulse generator of claim 3,
wherein the plurality of resistors comprise:
a first resistor connected between the tap and a first node;
a second resistor connected between the first node and a second node;
a third resistor connected between the second node and a third node;
a fourth resistor connected between the third node and a fourth node;
a fifth resistor connected between the fourth node and a fifth node;
a sixth resistor connected between the fifth node and a sixth node;
a seventh resistor connected between the sixth node and a seventh node;
an eighth resistor connected between the seventh node and an eighth node;
a ninth resistor connected between the eighth node and a ninth node; and
a tenth resistor connected between the ninth node and a tenth node;
wherein the plurality of switches comprise:
a third switch connected between the first node and the second node, the third switch operated by a logical AND between a third bit and a fourth bit of a dither control word;
a fourth switch connected between the second node and the third node, the fourth switch operated by a logical AND between a second bit and the fourth bit of the dither control word;
a fifth switch connected between the third node and the fourth node, the fifth switch operated by a logical AND between a first bit and the fourth bit of the dither control word;
a sixth switch connected between the fourth node and the fifth node, the sixth switch operated by a logical AND between a zeroth bit and the fourth bit of the dither control word;
a seventh switch connected between the fifth node and the sixth node, the seventh switch operated by the fourth bit of the dither control word; an eighth switch connected between the sixth node and the seventh node, the eighth switch operated by a logical OR between the third bit and fourth bit of the dither control word;
a ninth switch connected between the seventh node and the eighth node, the ninth switch operated by a logical OR between the second bit and fourth bit of the dither control word;
a tenth switch connected between the eighth node and the ninth node, the tenth switch operated by a logical OR between the first bit and fourth bit of the dither control word; and
an eleventh switch connected between the ninth node and the tenth node, the eleventh switch operated by a logical OR between the zeroth bit and fourth bit of the dither control word;
wherein the second switch is connected between the tenth node and ground; and
further comprising control circuitry configured to periodically increment the dither control word from a first binary value to a second binary value, and once the dither control word has reached the second binary value, periodically decrement the dither control word from the second binary value back to the first binary value.

8. The pulse generator of claim 7, wherein a resistance of the second resistor is equal to eight times a base resistance value, a resistance of the third resistor is equal to four times the base resistance value, a resistance of the fourth resistor is equal to two times the base resistance value, a resistance of the fifth resistor is equal to the base resistance value, a resistance of the sixth resistor is equal to four times the base resistance value, a resistance of the seventh resistor is equal to sixteen times the base resistance value, a resistance of the eighth resistor is equal to eight times the base resistance value, a resistance of the ninth resistor is equal to four times the base resistance value, and a resistance of the tenth resistor is equal to two times the base resistance value.

9. The pulse generator of claim 1, wherein the voltage to current converter arrangement comprises:
a first transistor configured to generate a first current based upon a gate drive voltage;
a first amplifier configured to generate and modulate the gate drive voltage based on a comparison between the dithered reference voltage and a feedback voltage representative of the first current; and
a current mirror configured to mirror the first current to produce the charging current.

10. The pulse generator of claim 9,
wherein the first transistor comprises a first transistor having a first conduction terminal connected to a third node, a second conduction terminal connected to a second node, and a control terminal coupled to the gate drive voltage; and
wherein the current mirror comprises: a second transistor having a first conduction terminal coupled to a first given voltage, a second conduction terminal connected to the third node, and a control terminal connected to the third node; and a third transistor having a first conduction terminal coupled to the first given voltage, a second conduction terminal connected to the timing capacitor, and a control terminal connected to the third node.

11. The pulse generator of claim 10,
wherein the first amplifier has a first input coupled to the tap to receive the dithered reference voltage, a second input coupled to the second node, and an output coupled to the control terminal of the first transistor; and
further comprising a sense resistor connected between the second node and a second given voltage.

12. A method for generating pulses that set an on-time for switching a DC-DC converter, the method comprising:
generating a dithered reference voltage by incrementally changing a resistance seen at a tap of a voltage divider so that the dithered reference voltage is modulated in a stair-stepped triangular fashion;
generating a charging current having a magnitude that is based upon the dithered reference voltage;
receiving the charging current at a timing capacitor so that the charging current charges the timing capacitor; and
comparing a voltage across the timing capacitor to a non-dithered reference voltage and asserting or deasserting a pulse based upon the comparison, with a width of the pulse being set as a function of a rate of the charging of the timing capacitor by the charging current.

13. The method of claim 12, wherein the resistance seen at the tap of the voltage divider is incrementally changed by:
selectively shorting different ones of a plurality of resistors series connected between the tap and ground by closing respective ones of a plurality of switches connected across corresponding ones of the plurality of resistors.

14. The method of claim 13, wherein the plurality of resistors vary in resistance by powers of two.

15. The method of claim 13, wherein each of the plurality of switches is closed in response to assertion of a different bit of a dither control word.

16. The method of claim 13, wherein each of a first subset of the plurality of switches is closed in response to a result of a logical AND operation between two different bits of a dither control word, and wherein each of a second subset of the plurality of switches is closed in response to a result of a logical OR operation between two different bits of the dither control word.

17. The method of claim 16, wherein a remaining one of the plurality of switches that is not within the first subset or the second subset is closed in response to assertion of one of the bits of the dither control word.

* * * * *